(12) United States Patent
Prakash et al.

(10) Patent No.: US 10,504,569 B2
(45) Date of Patent: Dec. 10, 2019

(54) SYSTEM AND METHOD FOR CONTROLLING PHASE ALIGNMENT OF CLOCK SIGNALS

(71) Applicant: INVECAS TECHNOLOGIES PVT. LTD., Hyderabad (IN)

(72) Inventors: Gyan Prakash, Hatia Ranchi (IN); Nidhir Kumar, Bangalore (IN); Muniswara Reddy Vorugu, Chittoor (IN)

(73) Assignee: INVECAS TECHNOLOGIES PVT. LTD, Hyderabad (IN)

( * ) Notice: Subject to any disclaimer, the term of this patent is extended or adjusted under 35 U.S.C. 154(b) by 0 days.

(21) Appl. No.: 15/577,340

(22) PCT Filed: Jun. 30, 2016

(86) PCT No.: PCT/IN2016/000170
§ 371 (c)(1),
(2) Date: Nov. 27, 2017

(87) PCT Pub. No.: WO2017/006339
PCT Pub. Date: Jan. 12, 2017

(65) Prior Publication Data
US 2019/0066740 A1    Feb. 28, 2019

(30) Foreign Application Priority Data
Jul. 3, 2015    (IN) .......................... 1782/CHE/2015

(51) Int. Cl.
| | |
|---|---|
| *G11C 7/10* | (2006.01) |
| *G11C 7/22* | (2006.01) |
| *H03L 7/00* | (2006.01) |
| *H03L 7/081* | (2006.01) |
| *G11C 8/06* | (2006.01) |
| *G06F 1/10* | (2006.01) |
| *H03L 7/091* | (2006.01) |

(52) U.S. Cl.
CPC ............. *G11C 7/1093* (2013.01); *G06F 1/10* (2013.01); *G11C 7/109* (2013.01); *G11C 7/222* (2013.01); *G11C 8/06* (2013.01); *H03L 7/00* (2013.01); *H03L 7/0812* (2013.01); *H03L 7/0814* (2013.01); *H03L 7/091* (2013.01)

(58) Field of Classification Search
CPC ... G11C 7/222; G11C 11/4076; G11C 7/1066; G11C 7/1093; G11C 7/20; G11C 7/22; G11C 7/106; G11C 11/56
USPC ......................................... 327/156, 158, 161
See application file for complete search history.

(56) References Cited

U.S. PATENT DOCUMENTS

| | | | | |
|---|---|---|---|---|
| 7,671,647 B2 * | 3/2010 | Gomm | ..................... | G11C 7/22 327/158 |
| 2009/0201059 A1 * | 8/2009 | Osborne | ............... | H03L 7/0814 327/158 |

* cited by examiner

*Primary Examiner* — John W Poos
(74) *Attorney, Agent, or Firm* — Barry Choobin; Patent 360 LLC

(57) ABSTRACT

A system and method for aligning clock signals in a DDR DRAM module is disclosed. The system includes a phase detector circuitry, a controllable delay circuit, a first delay circuit and a synchronizing circuit. A clock signal is simultaneously transmitted through the first delay circuit and the controllable delay circuit. Subsequently, the clock signals transmitted through the first delay circuit and the controllable delay circuit are captured at the output thereof, and fed as inputs to the phase detector circuitry. The phase detector circuitry determines whether the clock signals are in phase, and accordingly adjusts the delay associated with the controllable delay circuit until the two clock signals are determined to be in phase.

7 Claims, 5 Drawing Sheets

SYSTEM AND METHOD FOR CONTROLLING PHASE ALIGNMENT OF CLOCK SIGNALS

CROSS REFERENCE TO RELATED APPLICATIONS

This patent application is a National Phase Application corresponding to the PCT Application No. PCT/IN2016/000170 filed on Jun. 30, 2016 with the title "SYSTEM AND METHOD FOR CONTROLLING PHASE ALIGNMENT OF CLOCK SIGNALS". This patent application claims the priority of the Indian Provisional Patent Application No. 1782/CHE/2015 filed on Jul. 3, 2015 with the title "A SYSTEM AND METHOD FOR PHASE ALIGNMENT OF CLOCK AND COMMAND FOR DDR DRAM CONTROLLER", the contents of which is included herein by the way of reference.

BACKGROUND

Technical Field

The present disclosure generally relates to integrated circuits. Particularly, the present disclosure relates to phase alignment of signals in an integrated circuit. More particularly, the present disclosure relates to phase alignment of signals in a DDR DRAM system.

Description of the Related Art

During the designing of an integrated circuit, due emphasis is to be provided for precise delay matching of internal synchronous paths thereby reducing skew across signals and increasing the timing budget and the corresponding data rates. Hence the onus has always been upon designing integrated circuits which incorporate comparatively higher clock rates and comparatively lesser skew, and pose comparatively fewer design and implementation related challenges when translated onto an Integrated Chip (IC).

The operational efficiency of a DDR DRAM module depends on factors such as (operating) temperature, voltage, on-chip variations (OCV) inter-alia. There is also a probability that the aforementioned factors create a mismatch between a clock signal (CLK) and the corresponding command signals (CMD) generated by DDR DRAM controller. Therefore, in order to overcome the probability of occurrence of such a mismatch, a plurality of well known calibration techniques could be employed at the DDR DRAM controller end.

At least some of the well known calibration techniques require active feedback from the DDR DRAM memory, and are restricted at least in terms of implementation to low power DDR DRAM modules. In one of the conventional calibration techniques, phase alignment between the clock signals and the corresponding command signals is achieved by operating the DDR DRAM module in a training mode, and forecasting the phase alignment between the clock signals and the corresponding command signals based on the feedback provided by the DDR DRAM module. The drawbacks of the aforementioned calibration include inter-alia excessive dependence on the feedback received from DDR DRAM, and the inability to incorporate regular DDR DRAM segments into its umbrella of operation.

Yet another conventional calibration method involves achieving a phase alignment between the clock signal and the corresponding command signals by creating a replica path connected to a phase detection flip-flop data input and the flip-flop clock input. The replica path is created in order to match the actual insertion delay of the clock path with any of the command paths to the flip-flop data input and the flip-flop clock input. However, the aforementioned conventional method might not produce accurate end-results in terms of path replication due to variations witnessed across the actual path and the replica path. Further, another disadvantage associated with the aforementioned technique is the difficulty involved in physical implementation of the replica path on an IC. Hence there was felt a need for an improved system and method for aligning the clock and command phases of a DDR DRAM module that successfully obviated the drawbacks described hitherto.

OBJECTS

An object of the present disclosure is to provide a system and method that does not necessitate the creation of a replica path for phase creation.

Yet another object of the present disclosure is to provide a system and method that brings about an increase in the accuracy associated with the process of phase alignment.

Still a further object of the present disclosure is to overcome the ill effects associated with component mismatch and on-chip variation inter-alia.

One more object of the present disclosure is to simplify the physical implementation of the DDR DRAM controller by not performing a strict path matching between widely distributed cells.

Yet another object of the present disclosure is to provide a system and method that envisages calibrating the Slave Delay Lock Loop (SDLL) during initialization of DDR DRAM system.

Another object of the present disclosure is to provide a system and method that ensures that 'setup' and 'hold' timings corresponding to the DDR DRAM controller are adhered to.

SUMMARY

The present disclosure envisages a method and system for aligning a clock signal in phase with the corresponding command signals, in a DDR DRAM module. In accordance with the present disclosure, a clock signal is provided as one of the inputs to a phase detection circuit. The clock signal is transmitted through a first delay circuit, and into the phase detection circuit. Further, a calibration data signal is also fed to the phase detection circuit as another input. It is preferred that both clock signal and the calibration data signal are delayed by introducing a predetermined amount of delay thereto. Preferably, the delay associated with the clock signal is equivalent to the delay associated with the calibration data signal.

In accordance with the present disclosure, the phase detection circuit receives the clock signal and calibration data signal as inputs, and subsequently generates a calibration output signal as a response to the received inputs. Subsequently, the calibration output signal is analyzed the delay associated with the controllable delay circuit is iteratively adjusted until the clock signal and calibration output signal are determined to be in phase. Subsequently, the delay (associated with the controllable delay circuit) which brought the clock signal and the calibration signal in phase, is set as the delay for the controllable delay circuit, and subsequently, the clock signal transmitted to the controllable delay circuit is delayed by the delay thus set, such that the clock signal transmitted through the first delay circuit is in phase with the clock signal transmitted through the controllable delay circuit.

BRIEF DESCRIPTION OF THE DRAWINGS

The other objects, features and advantages will be apparent to those skilled in the art from the following description and the accompanying drawings in which.

DETAILED DESCRIPTION

Figure 1:
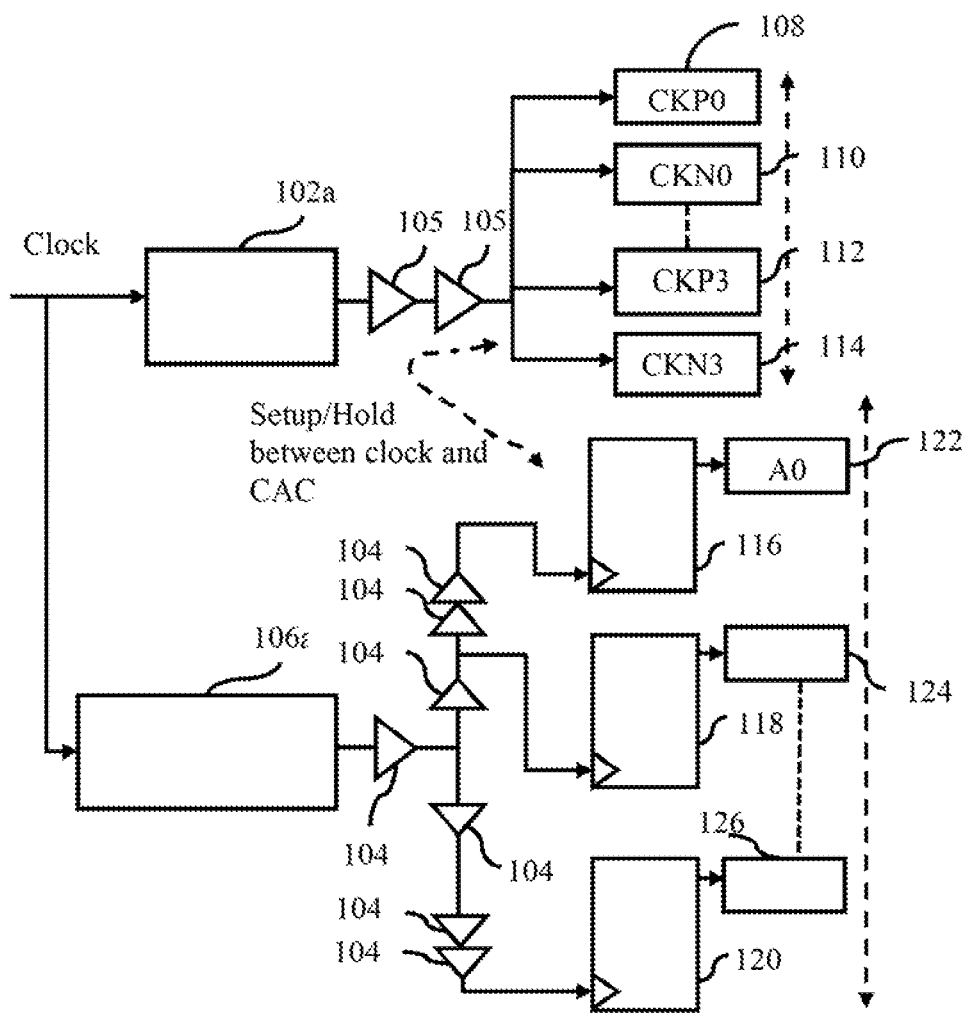
FIG. 1 is a block diagram illustrating a clock and command network (CAC) of a conventional DDR DRAM module.

Referring to FIG. 1, there is shown an illustration of the clock and command network distribution of a conventional DDR DRAM controller. Referring to FIG. 1, the clock and command network 100 is bifurcated primarily into a clock section 102 and Command Address Control (CAC) section 106. In accordance with the present disclosure, a clock signal is simultaneously transmitted to a first Slave Delay Lock Loop (SDLL) 102a, and to the second Slave Delay Lock Loop (SDLL) 106a.

In accordance with the present disclosure, the clock section 102 includes a plurality of differential pads represented by reference numerals 108, 110, 112 and 114 respectively. Further, the command, address and control (CAC) section 106 includes a plurality of single ended pads represented by reference numerals 122, 124 and 126 respectively. A plurality of buffer circuits represented by reference numeral 104 and 105 respectively, route the clock signal to the differential pads 108, 110, 112 and 114 and the single ended pads 122, 124 and 126.

In accordance with the present disclosure, the differential pads 108, 110, 112 and 114 function as 'clock output pads'. Typically, due to lower levels of clock distribution, lower levels of buffering are required for the differential pads 108, 110, 112 and 114. Typically, differential pads 108 and 110 generate positive clock signals, while differential pads 112 and 114 generate negative clock signals. In accordance with the present disclosure, the single ended pads 122, 124 and 126 are widely distributed in comparison to the differential pads 108, 110, 112 and 114, and therefore a plurality of buffer circuits collectively represented by reference numeral 104 are communicably coupled to the single ended pads 122, 124 and 126. Further, a plurality of buffer circuits collectively represented by reference numeral 105 are communicably coupled with differential pads 108, 110, 112 and 114.

Further, a plurality of synchronizing elements represented by reference numeral 116, 118 and 120 respectively are communicably coupled to the single ended pads 122, 124 and 126 for transmitting the data output thereof. Typically, the synchronizing elements 116, 118 and 120 are clocked through the SDLL 106a and through the buffer circuit(s) 104, while the differential pads 108, 110, 112 and 114 are clocked using the SDLL 102a and through the buffer circuit(s) 105. Accordingly, given the fact that the width of the single ended pads 122, 124 and 126 is comparatively larger than the width of the differential pads 108, 110, 112 and 114, there is felt a need to achieve a phase alignment, between the differential pads 108, 110, 112 and 114 and the single ended pads 122, 124 and 126, preferably by the way of calibration.

Figure 2:
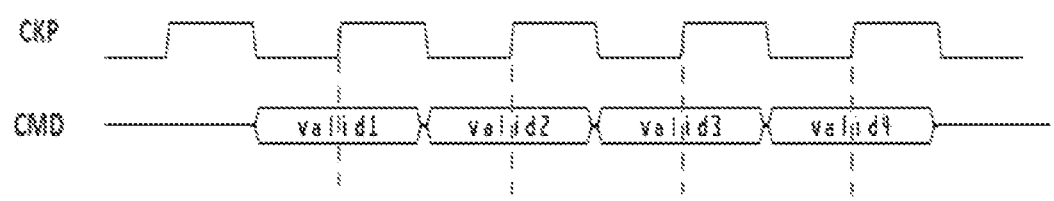
FIG. 2 is a timing diagram illustrating optimal 'setup' and 'hold' times for the conventional DDR DRAM module.

Referring to FIG. 2, there is shown a timing diagram depicting an optimum 'setup' time and 'hold' time for the conventional DDR DRAM module described in FIG. 1. Typically, the DDR DRAM module captures command signals, address and control signals on the rising edge of an input clock. In order to achieve an optimal phase alignment between the single ended pads and the differential pads, the 'setup' time (tIS) and the 'hold' time (tIH) are to be calibrated as illustrated in FIG. 2.

However, as described in the 'background' section, achieving an optimal phase alignment between the clock signal and the corresponding command signals (as illustrated in FIG. 2) involves dealing with certain drawbacks inherent to DDR DRAM subsystem including difference in transmission speed of the clock signal and the corresponding command signal, fluctuations in temperature and voltage, and on-chip variations (OCV). Further, the clock signals are typically misaligned with the corresponding command signals since the CAC section always transmits signals with a delay associated therewith due to the number of (electric) components in the CAC section as well as due to the distributed nature in which the components are arranged. Therefore, in view of the disadvantages discussed hitherto, there is felt a need for a system and method for aligning the clock signal with the corresponding command signals.

Figure 3:
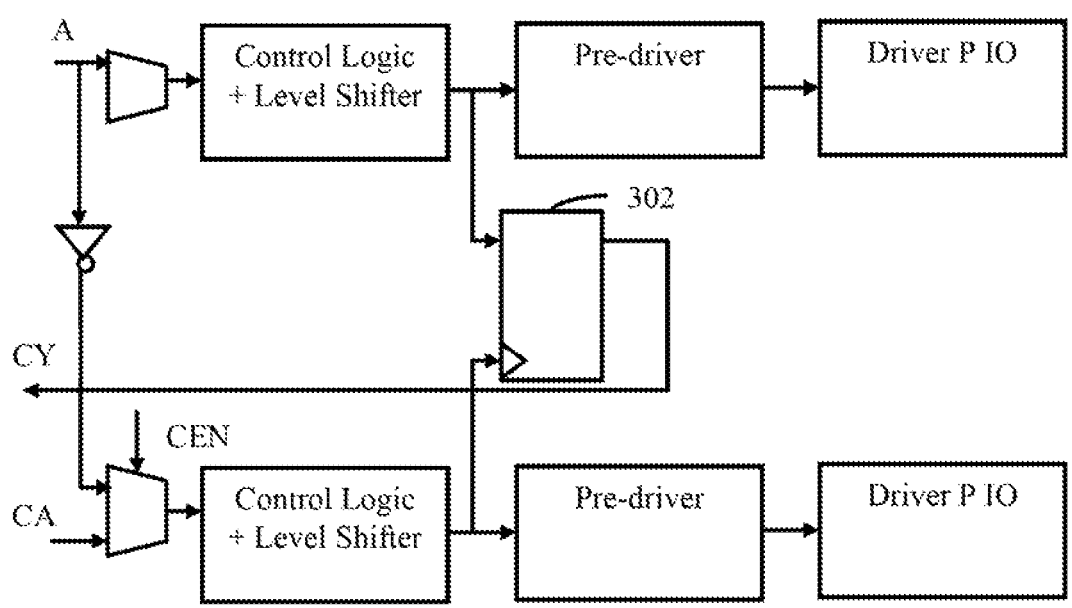
FIG. 3 is a block diagram illustrating a differential I/O arrangement incorporated into the conventional DDR DRAM module for calibration in accordance with the present disclosure.

Referring to FIG. 3, there is shown a circuit diagram illustrating the differential IO with a phase detection circuit 300, in accordance with the present disclosure. The phase detection circuit 300 incorporates a Calibration Enable pin (CEN) which when set to '1' renders the phase detection circuit 300 to work in a calibration mode and receive a clock signal (A) and a calibration data signal (CA) as inputs. The phase detection circuit 300 receives the clock signal (A) via a first delay circuit (not shown in FIG. 3), and the calibration data signal (CA) via a flip-flop (not shown in FIG. 3). The phase detection circuit 300 includes a phase detection flip-flop 302 that acts upon the clock signal (A) and the calibration data signal (CA), and generates a calibration output signal (CY) based on the clock signal (A) and the calibration data signal (CA). Typically, the clock signal (A) is, fed to the data input terminal of the phase detection flip-flop 302 and the calibration data signal (CA) is fed to the clock input terminal of the phase detection flip-flop 302. The phase detection flip-flop 302 changes its corresponding state, when the clock signal (A) is in phase with the calibration data signal (CA), and the said transformation in the output of the phase detection flip-flop 302 is captured as the calibration output signal (CY). The phase detection circuit 300 provides the calibration output signal (CY) indicative of the phase difference between the clock signal (A) and the calibration data signal (CA), as the output.

In accordance with the present disclosure, the phase detection flip-flop 302 changes its current state when the clock signal (A) is in phase with the calibration data signal (CA), and the calibration output signal (CY) generated as an output by the phase detection flip-flop 302 is indicative of the phase difference between the clock signal (A) and the calibration data signal (CA).

Figure 4:
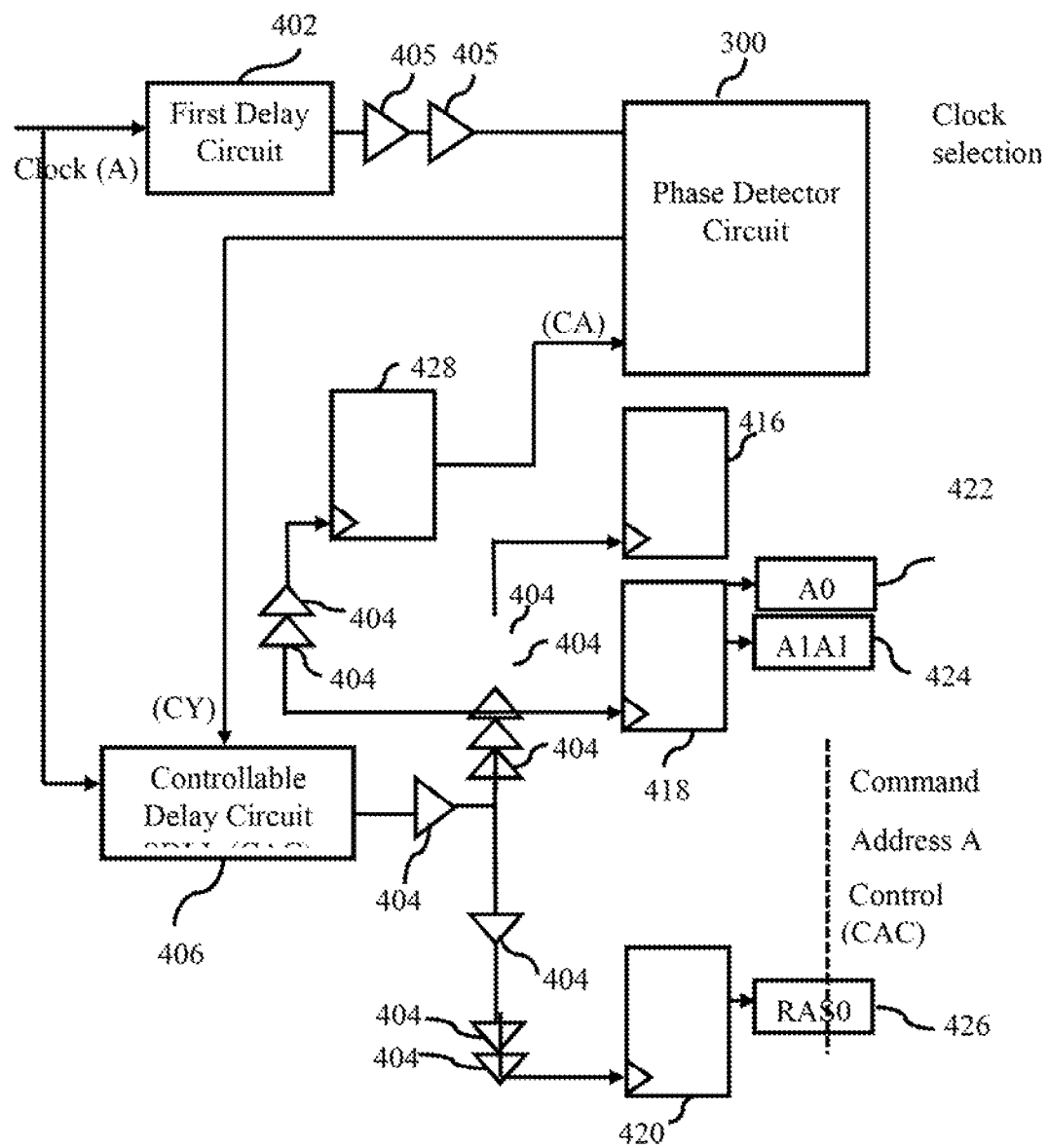
FIG. 4 is a circuit diagram illustrating the circuitry for controlling the alignment of clock signals, in accordance with the present disclosure.

Referring to FIG. 4, there is shown a circuit diagram illustrating the circuitry 400 for controlling phase alignment of clock signals, in accordance with the present disclosure. The circuitry 400 receives clock signals (A) as well as command signals corresponding to data access requests. For ensuring a reliable operation, it is deemed imperative that the (output) address signals corresponding to the data access requests are aligned in line with the clock signals, such that the center of the eye outputting the address, command and control is aligned at the rising edge of the clock signals at the corresponding clock output pads.

In accordance with the present disclosure, the clock signals (A) are transferred from the clock input along a first path via the first delay circuit 402 to the phase detector circuit 300 (illustrated in detail in FIG. 3), as an input. The first delay circuit 402 is preferably in the form of a Slave Delay Lock Loop (SDLL). The first delay circuit 402 always provides a fixed delay to the first path. There may be one or more buffers circuits 404 between the first delay circuit 402 and the phase detector circuit 300. The first delay circuit 402 adds a predetermined/fixed delay to the first path, and this delay is set by the value DLL_fix.

Further, a second clock path runs from the clock input to a controllable delay circuit 406. The controllable delay circuit 406 is preferably a controllable Slave Delay Lock Loop (controllable SDLL). The controllable delay circuit 406 lies in the path of the command outputs 422, 424 and 426 that output the addresses for data access, and is governed by a delay signal DLL_SET which is controlled by a control mechanism embedded in the controllable delay circuit 406.

In accordance with the present disclosure, the second clock path is extended from the controllable delay circuit 406 to the command output pads 422, 424 and 426, via a plurality of synchronizing elements 416, 418 and 420. The delay on the second clock path is controlled by the signal DLL_SET which incorporates a 'delay value' calculated by the controllable delay circuit 406. The clock signal sent along the second clock path clocks the synchronizing elements 416, 418, 420 which in turn control the timing of the output of the address, command and control signals at output pads 422, 424 and 426 respectively. There are some buffer circuits (collectively represented by reference numeral 404) in between the synchronizing elements 416, 418 and 420, and the command output pads 422, 424 and 426.

The circuitry 400 includes a further synchronizing element 428 which is configured to mirror synchronizing elements 416, 418 and 420. The synchronizing element 428 is typically arranged in parallel with the synchronizing elements 416, 418 and 420. The synchronizing element 428 generates a calibration data signal (CA) which is in turn provided as another input to the phase detector circuitry 300.

In accordance with the present disclosure, initially the value of DLL_fix is set as equivalent to the value of DLL_SET. The controllable delay circuit 406 iteratively adjusts the delay signal DLL_SET and monitors the output (CY) from the phase detector circuit 300. When the output (CY) from the phase detector circuit 300 indicates that the clock signals (A) from the first delay circuit 402 and the calibration data signals (CA) from the synchronizing element 428 are aligned (in phase with one another), then the DLL_SET that caused the said alignment is considered as the 'delay value' for the delay associated with the controllable delay circuit 402. The delay value thus determined causes alignment of clock signals on the first path and the second path. In accordance with the present disclosure, the controllable delay circuit 406 iteratively adjusts the delay signal DLL_SET until the clock signal (A) and the calibration data signal (CA) are determined to be in phase with one another.

Figure 5:
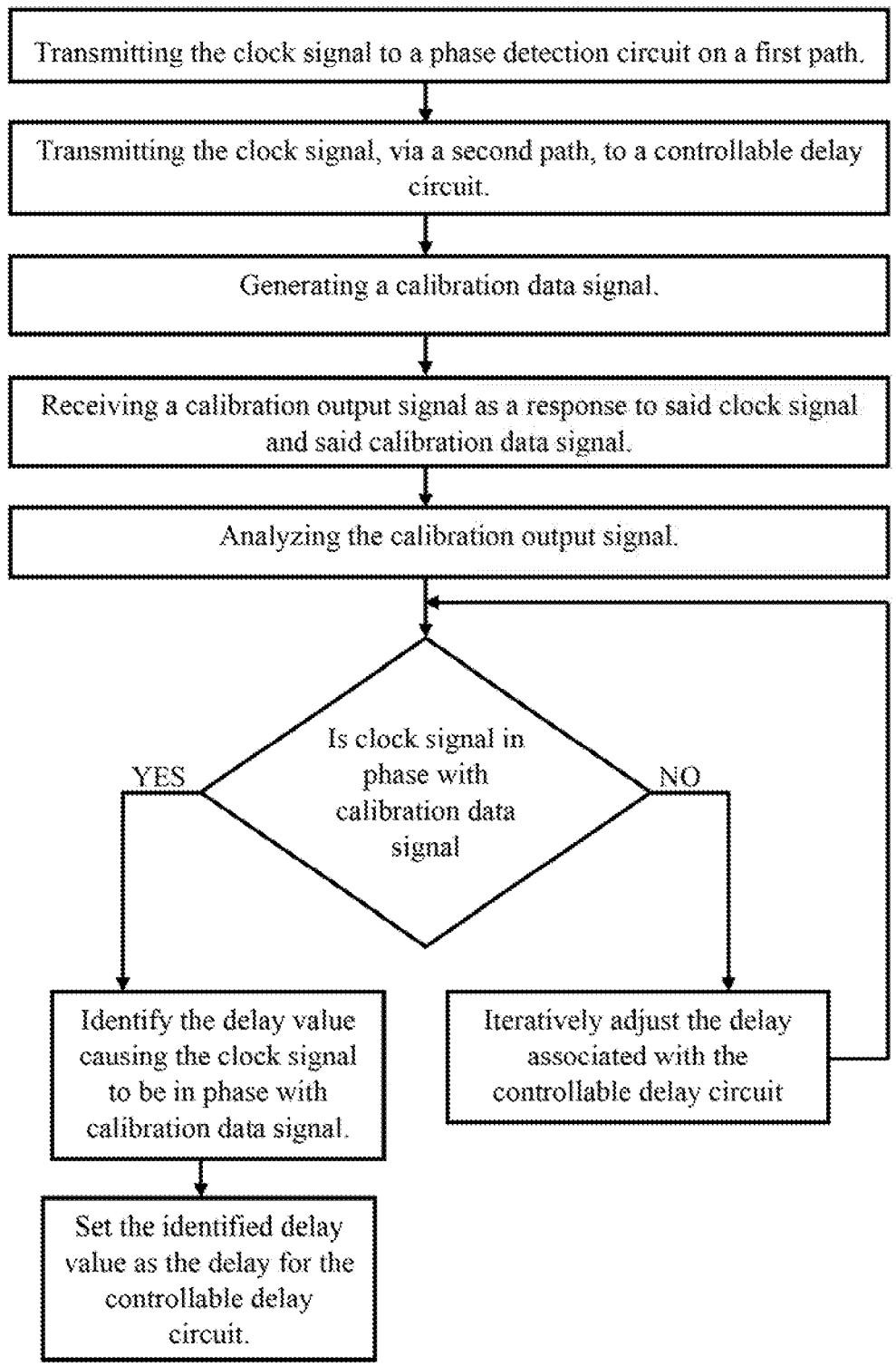
FIG. 5 is a flowchart illustrating the steps involved in a method for phase alignment of clock signals, in accordance with the present disclosure.

Further, the present disclosure envisages a method for controlling phase alignment of clock signals. The Method envisaged by the present disclosure is illustrated as a combination of a plurality of steps in FIG. 5. In accordance with the present disclosure, initially a clock signal is received and the clock signal (A) is transmitted via a first delay circuit and into a phase detector circuit. The clock signal is also transmitted on a second clock path to a controllable delay circuit, which in turn transmits the clock signals onto a plurality of synchronizing elements (synchronizing elements preferably arranged in parallel to form a synchronizing circuit) used for transmitting address signals to the command output pads.

During calibration, it is determined whether the clock signal (A) transmitted through the first delay circuit is in phase (aligned) with the clock signal at the output to the combination of synchronizing elements (synchronizing circuit). If the signals are determined to be out of phase with one another, then the delay associated with the controllable delay circuit is iteratively adjusted until the signals are in phase with one another. If the controllable delay circuit is on a comparatively longer path (with reference to the path associated with the first delay circuit), then the delay (value) is preferably decremented until the signals are aligned with one another. However, if the controllable delay circuit is on a comparatively shorter path (with reference to the path associated with the first delay circuit), then the delay is preferably incremented until the signals are aligned with one another.

In accordance with the present disclosure, during calibration, if the clock signal (A) transmitted through the first delay circuit is in phase (aligned) with the clock signal to the output to the combination of synchronizing elements, then the phenomenon of the two signals being in phase is captured by one of the synchronizing elements via analysis of a calibration data signal (CA) fed to the 'clock input' of the synchronizing element from the controllable delay circuit. If the aforementioned two clock signals are determined to be in phase, then the said synchronizing element changes its current state, and such a change in the state is captured using a calibration output signal (CY) which is fed back to the controllable delay circuit for further processing. In such a case, the delay that caused both the aforementioned signals to be in phase is considered as the 'delay' corresponding to the controllable delay circuit. However, if the two signals are determined not to be in phase, then the delay associated with the controllable delay circuit is iteratively adjusted until the two signals are in phase.

The technical advantages envisaged by the present disclosure include the realization of a system and method for alignment of clock signals and command signals in a DDR DRAM module. The system and method does not necessitate the creation of a replica path for phase creation. Further, the system and method brings about an increase in the accuracy associated with the process of alignment of clock signals and the corresponding command signals (phase alignment). The system and method bring about an increase in the accuracy associated with the process of phase alignment. Further, the ill effects associated with component mismatch and on-chip variation amongst other ill effects are also eliminated. The present disclosure also simplifies the physical implementation of the DDR DRAM controller by not performing a strict path matching between widely distributed cells. The system and method proposed by the present disclosure, bring about the calibration of the Slave Delay Lock Loop (SDLL) during initialization of DDR DRAM system, and also ensure that 'setup' and 'hold' timings corresponding to the DDR DRAM controller are adhered to.

What is claimed is:

1. A method for controlling phase alignment of clock signals, said method comprising the following steps:
   receiving a clock signal, and transmitting the clock signal to at least one phase detection circuit, as a first input, via a first delay circuit and on a first path;
   transmitting the clock signal, via a second path, to a controllable delay circuit, as a first input;
   generating a calibration data signal, and transmitting said calibration data signal to said phase detection circuit as a second input, wherein the step of generating said calibration data signal further includes the following steps:
      capturing the clock signal output by said controllable delay circuit;
      feeding said clock signal output by said controllable delay circuit into a synchronizing circuit; and
      configuring said synchronizing circuit to generate the calibration data signal based on said clock signal fed thereto;
   receiving a calibration output signal as a response to said clock signal and said calibration data signal, from said phase detection circuit;
   analyzing said calibration output signal at the controllable delay circuit and iteratively calibrating a delay corresponding to the controllable delay circuit, at least based on said calibration output signal, until the clock signal and the calibration data signal are determined to be in phase, and determining a delay value that brought the clock signal in phase with the calibration data signal; and
   assigning said delay value as the delay corresponding to the controllable delay circuit, and causing the clock signal transmitted to the controllable delay circuit to be delayed by said delay value such that the clock signal transmitted from said controllable delay circuit is in phase with the clock signal transmitted to said first delay circuit.

2. The method as claimed in claim 1, wherein the step of transmitting the clock signal to at least one phase detection circuit, further includes the step of selectively adding a delay to said clock signal using said first delay circuit.

3. The method as claimed in claim 1, wherein the step of adding a predetermined amount of delay to said calibration data signal, further includes the step of adding to said calibration data signal, a delay at least equal to the delay added to the clock signal.

4. The method as claimed in claim 1, wherein the step of receiving a calibration output signal as a response to said clock signal and said calibration data signal, further includes the following steps:
   providing said clock signal and said calibration data signal to a phase detector flip flop;
   configuring said phase detector flip-flop to generate calibration output signal as a response to said clock signal and said delayed calibration data signal, for every pulse thereof;
   configuring said phase detector flip-flop to determine, based on said calibration output signal, whether said clock signal is in phase with said calibration data signal;
   configuring said phase detector flip-flop to change a state thereof, in the event that said clock signal is determined to be in phase with said calibration data signal; and
   iteratively calibrating the delay corresponding to the controllable delay circuit until a change in the state of said phase detector flip-flop is identified.

5. A circuitry for controlling phase alignment of clock signals, said circuitry comprising:
   a first delay circuit, said delay circuit receiving a clock signal, said delay circuit further configured to transmit said clock signal to a phase detection circuit;
   a phase detection circuit, said phase detection circuit configured to receive said clock signal from the first delay circuit, and a calibration data signal from a synchronizing circuit, as inputs thereto, said phase detection circuit further configured to determine whether there exists a phase difference between said clock signal and said calibration data signal, said phase detection circuit further configured to generate a calibration output signal based on phase difference between clock signal and said calibration data signal; and
   a controllable delay circuit, said controllable delay circuit configured to receive said calibration output signal, said controllable delay circuit configured to iteratively calibrate a delay corresponding thereto, based on the calibration output signal received from said phase detection circuit until the clock signal and the calibration data signal are determined to be in phase, said controllable delay circuit further configured to determine a delay value that brought the clock signal in phase with the calibration data signal, and delay the clock signal transmitted there from at least by said delay value such that the clock signal transmitted from said controllable delay circuit is in phase with the clock signal transmitted to said first delay circuit;
   wherein said synchronizing circuit includes at least two flip-flops arranged in parallel, and wherein at least one of said flip-flops is configured to capture the clock signal output from said controllable delay circuit, said flip-flop further configured to generate the calibration data signal based on captured clock signal.

6. The circuitry as claimed in claim 5, wherein said phase detection circuit further includes a phase detector flip-flop, said phase detector flip-flop configured to receive the clock signal from the first delay circuit on a data input terminal, and further receive said calibration data signal from the synchronization circuit on a clock input terminal, said phase detector flip-flop configured to undergo a change in a state thereof, in the event that the clock signal is in phase with said calibration data signal.

7. The circuitry as claimed in claim 6, wherein said phase detector flip-flop is configured to generate the calibration output signal, for every pulse corresponding to said calibration data signal.

* * * * *